(12) United States Patent
Ewe et al.

(10) Patent No.: US 7,479,691 B2
(45) Date of Patent: Jan. 20, 2009

(54) POWER SEMICONDUCTOR MODULE HAVING SURFACE-MOUNTABLE FLAT EXTERNAL CONTACTS AND METHOD FOR PRODUCING THE SAME

(75) Inventors: Henrik Ewe, Burglengenfeld (DE); Stefan Landau, Wehrheim (DE); Klaus Schiess, Allensbach (DE); Robert Bergmann, Regensburg (DE)

(73) Assignee: Infineon Technologies AG, Munich (DE)

( * ) Notice: Subject to any disclaimer, the term of this patent is extended or adjusted under 35 U.S.C. 154(b) by 389 days.

(21) Appl. No.: 11/376,871

(22) Filed: Mar. 16, 2006

(65) Prior Publication Data

US 2007/0246808 A1  Oct. 25, 2007

(30) Foreign Application Priority Data

Mar. 16, 2005  (DE) .................. 10 2005 012 489

(51) Int. Cl.
 *H01L 23/495* (2006.01)
(52) U.S. Cl. .............. 257/666; 257/672; 257/674; 257/676; 257/690; 257/E23.004; 257/E23.031; 257/E23.036; 257/E23.052; 257/E23.059
(58) Field of Classification Search ......... 257/678–733, 257/787–796, E23.01–E23.194, 666–677, 257/E23.004; 438/15, 26, 51, 55, 64, 106, 438/109, 124–127, 111, 112, 123, FOR. 366, 438/FOR. 367, FOR. 380, 643–685
See application file for complete search history.

(56) References Cited

U.S. PATENT DOCUMENTS

| 6,423,623 | B1 * | 7/2002 | Bencuya et al. ............. 438/612 |
| 6,774,466 | B1 * | 8/2004 | Kajiwara et al. ............ 257/673 |
| 6,906,386 | B2 * | 6/2005 | Williams et al. ........... 257/355 |
| 7,285,863 | B2 * | 10/2007 | Kanda ....................... 257/774 |

\* cited by examiner

*Primary Examiner*—Jasmine J Clark
(74) *Attorney, Agent, or Firm*—Dicke, Billig & Czaja, PLLC

(57) ABSTRACT

A power semiconductor module having surface-mountable flat external contact areas and a method for producing the same is disclosed. In one embodiment, the top sides of the external contacts form an inner housing plane, on which at least one power semiconductor chip is fixed by its rear side on a drain external contact. An insulation layer covers the top side over the edge sides of the semiconductor chip as far as the inner housing plane whilst leaving free the source and gate contact areas on the top side of the semiconductor chip and also whilst partly leaving free the top sides of the corresponding external contacts. Arranged on the insulation layer is a connecting conductive layer between the source contact areas on the top side of the semiconductor chip and the top sides of the source external contacts, and also a gate connecting layer from the gate contact areas to the top side of the gate external contact.

23 Claims, 4 Drawing Sheets

POWER SEMICONDUCTOR MODULE HAVING SURFACE-MOUNTABLE FLAT EXTERNAL CONTACTS AND METHOD FOR PRODUCING THE SAME

CROSS-REFERENCE TO RELATED APPLICATIONS

This Utility Patent Application claims priority to German Patent Application No. DE 10 2005 012 489.5 filed on Mar. 16, 2005, which is incorporated herein by reference.

BACKGROUND OF THE INVENTION

The invention relates to a power semiconductor module in a plastic housing having surface-mountable flat external contacts and to a method for producing the same using a planar connecting technique on a metallic leadframe. In the case of such a power semiconductor module having surface-mountable flat external contacts, the external contact areas of the external contacts are arranged on the underside of the semiconductor module. Such a power semiconductor module has at least one power semiconductor chip, the top side of the power semiconductor chip having source contact areas and gate contact areas and the rear side of the semiconductor chip having a drain contact area.

Making contact with power semiconductor devices, in particular power semiconductor modules having a high current density in a plastic housing, is problematic owing to the high evolution of heat loss. This is because said heat loss has to be dissipated within the plastic housing via connections with the highest possible electrical and thermal conductivity from the contact areas of the semiconductor chip to corresponding connection contacts of a metallic leadframe.

One conventional connecting technique is wire contact-making. In this case, the connections are produced by means of bonding wires made of gold or aluminum, the contact between the bonding wires and the contact areas on the semiconductor chip and also the contact areas on a leadframe arising as a result of the metals involved being alloyed with energy being supplied. However, the relatively small cross-sectional areas of the wire connections are critical for a high connecting resistance. Moreover, such wire connections are an obstacle to further shrinking of the contact areas on the top side of the semiconductor chip, advancing chip miniaturization and increasing integration.

Further disadvantages of such bonding wire technologies are the thermomechanical loading on the semiconductor chip upon contact-making and the possible bonding wire drifting in the course of molding composition encapsulation of the module components in the course of embedding into a plastic housing composition. Furthermore, a further weak point for instances of bonding wires being torn away are the molten and subsequently recrystallized regions at the contact areas. Ageing processes of the alloy compounds are observed there, diffusion processes constituting a creeping increase in the contact resistance and hence a reliability problem for the power semiconductor module.

An alternative has been developed for P-TDSON housings (Plastic Thin Dual Small Outline Non leaded package). This alternative contact-making method is also known by the term "clamping clip method", a metal clip instead of the bonding wires enabling large-area contact to be made with the source contact areas on account of its larger cross-sectional area, which leads to a reduction of the electrical resistance. At the same time, the clamping clip method improves the dissipation of heat from the chip top sides by virtue of a reduced thermal resistance and an increased heat buffer capacity of such a clamping clip connection. However, on account of its dimensions, the clip construction limits advancing and improved integration of power semiconductor chips in corresponding power semiconductor modules.

The flexibility of such clip structures is low with regard to the arrangement of the bonding contact areas, for which reason a change in each case necessitates a new clip construction. The contact-making on the contact areas of the semiconductor chip or on the contact pads of the "leadframe" is effected by soldering using a solder paste. The elimination of flux residues by means of a subsequent cleaning process forms a critical operation in this case. The flux residues have perfect adhesion on the components in the course of embedding and adversely influence the reliability of the power semiconductor module. In addition, fatigue cracks in the solder connections in the event of thermomechanical loading are a reliability problem.

The document WO 2004/077584 A2 discloses large-area metal coatings which are applied to an insulation layer of a substrate and in this case simultaneously produce the connection to contact areas on the top side of semiconductor chips. This technology requires, as the leadframe, a correspondingly prepared large-area substrate such as is known as a wiring substrate for BGA devices. Such prerequisites of a large-area plane substrate are not imposed, however, in the case of device housings such as the P-TDSON housing or P-VQFN housing (Plastic Very thin profile Quad Flat Non leaded package).

The document U.S. Pat. No. 5,637,922 also offers solutions with metal layers applied in large-area fashion and works on the basis of a conventional leadframe with flat conductors projecting laterally from the housing. Furthermore, the publication "Planar Metallization Interconnected 3-D Multichip Module" by Zhenxean Liang et al., 53. Electronic Compounds and Technology Conference 2003, pages 1090-1094, discloses orienting power semiconductor devices made of silicon with ceramic substrates in such a way that large-area metal coatings on the coplanar top side having ceramic substrate and semiconductor chip surface become possible without great disturbances. However, even this solution has the disadvantage that it is not very flexible and cannot readily be applied to power semiconductor modules having a plastic housing and having surface-mountable contacts such as the P-TDSON or the P-VQFN housings offer or have.

For these and other reasons, there is a need for the present invention.

SUMMARY

The present invention provides contact-making possibilities within power semiconductor modules in plastic housings which can keep up with the miniaturization particularly in the case of P-TDSON or P-VQFN housings and can be adapted to the continuous miniaturization.

In one embodiment, the invention provides a power semiconductor module having surface-mountable flat external contacts, which provide external contact areas on the underside of the power semiconductor module. The power semiconductor module has at least one power semiconductor chip, the top side of the power semiconductor chip having source contact areas and gate contact areas and the rear side of the semiconductor chip having a drain contact area. The flat external contacts have top sides arranged in an inner housing plane. The drain contact area of the rear side of the semiconductor chip is fixed on the top side of a drain external contact. An insulation layer, an insulation film, covers the top side and edge sides of the semiconductor chip, and also the housing plane whilst leaving free the source and gate contact areas on the top side of the semiconductor chip. Furthermore, the insulation layer covers the top sides of the source and gate external contacts whilst leaving free contact pads. In this case, the insulation layer bridges an interspace between the external contacts in the region of the inner housing plane in approximately planar fashion.

A further embodiment of the invention relates to a power semiconductor module having surface-mountable flat external contacts which are provided on the underside of the semiconductor module. This power semiconductor module has at least one power semiconductor chip, the top side of the power semiconductor chip having source contact areas and gate contact areas and the rear side of the semiconductor chip having a drain contact area. Moreover, the flat external contacts have top sides arranged in an inner housing plane and having external contact areas on the underside of the plastic housing.

In this case, the drain contact area of the semiconductor chip is fixed on the top side of a drain external contact. An insulation film covers the top side and the edge sides of the semiconductor chip and also the housing plane whilst leaving free the source and gate contact areas on the top side of the semiconductor chip and also whilst partly leaving free the top sides of the source and gate external contacts. Arranged on said insulation film is a metallic source connecting layer as high-current stripline, which extends on the insulation film from the source contact areas to the top sides of the source external contacts. Furthermore, arranged on the insulation film is at least one gate connecting layer as signal stripline, which extends from the gate contact areas on the semiconductor chip to the top side of the gate external contact whilst bridging the interspace between the external contacts.

These power semiconductor modules have the advantage that the source contact areas on the top side of the semiconductor chip are interconnected to form a large-area connecting layer, in which case both the pitch of the source contact areas and the areal extent of the individual source contact area can be decreased as desired without a reliable connection to the areal metalization layer on the insulation layer tearing away. The same applies to the gate contact areas, which are brought together to form a smaller coating region and from there are directly connected to the top side of a gate external contact similarly to the source contact areas on the top side of the semiconductor chip via a corresponding gate connecting layer. Apart from the insulation layer, no further substrates or intermediate layers are required in order to electrically connect the source contact areas or the gate contact areas to the corresponding top sides of the external contacts in the region of the housing underside. In this case, it is furthermore possible to dispense with external flat conductors that extend toward the outside and take up a lot of space, and to manage completely with the available underside of the power semiconductor module for contact-making.

A further embodiment is that the miniaturization of such power semiconductor modules can now advance without new clamping clips having to be developed or corresponding external flat conductors or wiring substrates such as are still used in the prior art having to be adapted to the connecting layers or to the form of the semiconductor chip.

In a further embodiment of the invention, the insulation layer has a patterned insulation film that is laminated on. Such an insulation film which, on the one hand, covers the coplanar housing plane in so far as it is not taken up by the semiconductor chip with its drain contact, and moreover clings to the edges of the semiconductor chip and to the top side of the semiconductor chip is associated with the advantage that high flexibility becomes possible in the construction of a power semiconductor module and such power semiconductor modules can be produced inexpensively by cost-effective lamination of differently patterned layers or films on the top sides of the external contacts and on the top sides of the semiconductor chips.

As is generally known, insulation films are not rigid, but rather follow the thermal stresses by compensating expansion or contraction and afford the advantage that the connecting layer arranged thereon both for the source contact areas and for the gate contact areas can follow this expansion behavior without the occurrence of embrittlement or microcracking as are known from bonding wires. Such a film has the further advantage that it adapts to the conditions on the coplanar housing plane and can encapsulate without stresses the semiconductor chip arranged with its drain contact area on the coplanar housing plane. For this purpose, during the application of the insulation film, the entire system is heated to the softening temperature of the film. A further advantage is that the connecting film forms a bridge that bridges the innerspace between the external contacts in the region of the inner coplanar housing plane in approximately planar fashion and provides a platform for the application of the connecting layers.

In a further embodiment of the invention, the source and gate connecting layers have a multilayer metal layer. Said multilayer metal layer may have one lower metal layer for adhesion promotion and for improving the contact-making with the source contact areas and gate contact areas with which contact is to be made and may have a further metal ply, which ensures the required thickness for a low-resistance connection of the source and gate contact areas, respectively, to the corresponding source and gate external contacts.

In a further embodiment of the invention the source connecting layer and/or gate connecting layer has an upper metal layer made of copper or a copper alloy. This embodiment of the invention has the advantage that copper is a guarantee of a low-resistance electrical connection, and that said copper can be deposited with a large thickness by means of electrodeposition or chemical deposition on the top side of the insulation layer or the insulation film. Since this copper layer is not situated solely on the top side of the semiconductor chip, but rather must also reach as far as the coplanar inner housing plane, this low-resistance coating cannot already be applied in preparatory fashion on the corresponding semiconductor wafer, rather it is necessary to provide this deposition operation for the completion and mounting of the power semiconductor module.

Furthermore, the power semiconductor module likewise has a copper layer or a copper alloy at the flat surface-mountable external contacts. This copper layer or copper alloy was patterned from a sheet-metal strip into corresponding structures for the source external contact areas, the drain external contact area and/or the gate external contact area. An etching technique is used for this purpose. Solderable coatings may likewise be applied to the undersides of the external contacts. These solderable coatings have the advantage that the surface mounting of the external contacts of the power semiconductor module can be combined in a very simple manner with corresponding superordinate circuit boards.

In a further embodiment of the invention, the power semiconductor module has one or a plurality of stacked semiconductor chips on the power semiconductor chip, which are fixed on the top side of a power semiconductor chip in such a way that they take up part of the top side of the power semiconductor chip. Logic components are used as stacked semiconductor devices, the areal extent of said logic components being smaller than that of the power semiconductor chips. For the wiring of these stacked semiconductor chips on the power semiconductor chips, it is likewise possible to use the technique disclosed above with insulation layer and metallic connecting layers.

In the case of the stacked semiconductor device, it is even possible also to provide internal connecting layers between contact areas of the stacked semiconductor chip and contact areas of the power semiconductor chip. This can be effected by means of the same method process as the application of the connecting layers on the remaining components of the power semiconductor module. The corresponding connecting layers are thus produced at the same time as the connecting layers between source contact areas and source external contacts and also between gate contact areas and gate external contacts.

With the use of an insulation film, it is possible to ensure that the source and gate contact areas are kept free on the top side of the semiconductor chip by means of the insulation film having correspondingly stamped regions with passage openings prior to the application of said insulation film. Such a stamping technique is advantageous in the production of large-area contacts on the top side of the semiconductor chip and/or the top side of the external contacts. If, however, only small passage openings have to be provided through the insulation film, then it is advantageous firstly to apply the insulation film and then to achieve by means of laser ablation the situation in which the source contact areas and/or the gate contact areas are kept free on the top side of the semiconductor chip.

A method for producing a power semiconductor module having surface-mountable flat external contacts arranged on the underside of the plastic housing has the following method.

The first process involves producing an arrangement of flat external contacts for the surface-mountable semiconductor module in a flat conductor frame, the top sides of the external contacts being oriented in plane fashion and forming a coplanar inner housing plane. Moreover, a semiconductor chip is produced, the top side of the semiconductor chip having source contact areas and gate contact areas and the rear side of the semiconductor chip having a drain contact area. Said semiconductor chip is subsequently fixed by its drain contact area on its rear side on a top side of a drain external contact of the flat conductor frame.

A patterned insulation layer is then applied to this structure, said insulation layer being applied to the edge sides and the top side of the semiconductor chip and the coplanar housing plane whilst leaving free the source and gate contact areas and whilst partly leaving free the top sides of the external contacts. Finally, a patterned metal layer is applied as a planar connecting layer between source contact areas and surfaces of the source external contacts and also between gate contact areas on the top side of the semiconductor chip and the surfaces of the gate external contacts. After the application of this connecting layer, the finished components can then be embedded into a plastic housing composition, the external contacts projecting from the plastic housing composition with their external contact areas on the underside of the plastic housing.

This method has the advantage that, with increasing miniaturization, the insulation layer and the metallic connecting layer can also be reduced in size without any problems. Moreover, this method has the advantage that the entire construction of the semiconductor module can be effected on a flat conductor frame which only has external contacts and provides the latter on the underside of the semiconductor module.

Finally, the method with the planar connecting technique provided has the advantages of:

1. A low electrical resistance and a high effective dissipation of heat from the chip top side on account of the large connecting cross section in comparison with conventional bonding wires;

2. Fast and low-loss switching as a result of reduced leakage inductances of the relatively flat connecting layer;

3. The simultaneous production of all the connections and becomes continuously more advantageous as the number of connections that are to be produced in a housing increases;

4. A significantly higher integration density as a result of the reduction of the minimum contact area sizes required for the source contact areas and the gate contact areas;

5. High flexibility of the patterning process in conjunction with constructional changes in the contact area geometries;

6. Lining of the contact areas with a diffusion-inhibiting and/or adhesion-improving layer below the connecting layer, thereby avoiding reliability-relevant weak points at the metal contact points;

7. A stack construction with an alternate sequence of insulation and connecting layers, which affords diverse possibilities of line disentanglement as a result of the multilayer nature of the wiring layer;

8. A smaller structural height of the connection, which ultimately enables a flat housing construction.

Although planar connecting techniques exist in various embodiments, as mentioned above, application has hitherto been restricted to insulating substrates. The present invention realizes the use of a planar connecting technique in a leadframe-based plastic housing, in the case of which the insulation layer applied first forms a bridge carrying the connecting layer over the trenches between the drain external contact, on which the chip is arranged, and the further housing external contacts. The method described above thus involves successively applying an insulation layer and a metallic connecting layer to the leadframe populated with one or a plurality of semiconductor chips and also patterning them, to be precise in a manner which leads to large-area, flat connections between the contact areas of the semiconductor chip and the top sides of the external contacts.

In an implementation of the method, for the purpose of fixing the semiconductor chip, the latter is soldered on by its drain contact area on a top side of a drain contact of the flat conductor frame. In preparation for the soldering-on process, either the top side of the drain external contact may have a solder layer and/or the rear side of the semiconductor chip may be provided with a solder layer.

In a further embodiment of the invention, an electrically conductive adhesive is used instead of the solder layer. Said electrically conductive adhesive may also be realized by a double-sided adhesive, but electrically conductive film. This has the advantage that it is possible to avoid extreme heating for joining the semiconductor chip onto the drain external contact, especially as the temperatures for curing the adhesive layer or the adhesive film are tens of ° C. lower than the required temperatures for a soldering-on process.

As described above, an insulation film is used in this method in order to bridge the trenches between the individual external contact areas of the coplanar inner housing plane until all the assembled components are embedded in a plastic housing composition in the concluding method step. If an insulation film is used as the insulation layer, then it may already be prepared, prior to application, in such a way that corresponding passage openings are stamped in at the locations at which it is necessary to have access to the top sides of the external contacts and also access to the source contact areas and/or the gate contact areas on the top side of the semiconductor chip.

During a patterning of the insulation film, the corresponding source contacts or gate contacts and the corresponding regions of the top sides of the external contacts can be uncovered by laser ablation. The connecting layer may be applied ply by ply, a lower first ply being deposited by means of a sputtering method and this sputtered layer subsequently being the basis for depositing a second, correspondingly thicker connecting layer by means of an electrolytic method. An adhesion-promoting and/or a diffusion-inhibiting electrically conductive ply may be applied as the first ply in order from the outset to avoid adhesion problems and/or embrittlement problems as a result of diffusion and formation of intermetallic phases. The invention includes the use of the above method for producing semiconductor modules in particular in P-TDSON housings and/or in P-VQFN housings or modifications of these housing types.

BRIEF DESCRIPTION OF THE DRAWINGS

The invention will now be explained in more detail with reference to the accompanying figures.

DETAILED DESCRIPTION

Figure 1:
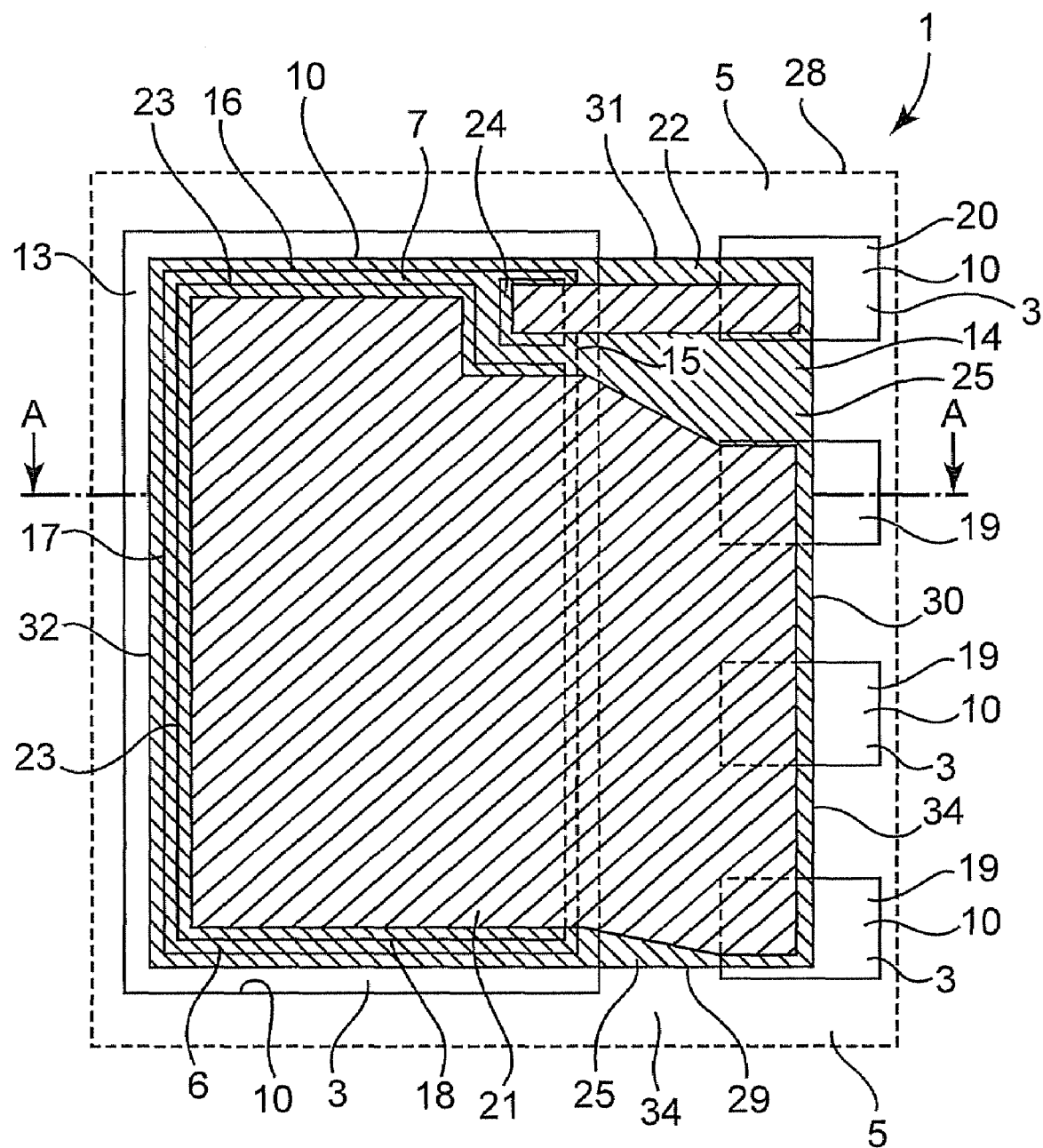
FIG. 1 illustrates a schematic plan view of a power semiconductor module of a first embodiment of the invention.

FIG. 1 illustrates a schematic plan view of a power semiconductor module 1 of a first embodiment of the invention. This power semiconductor module 1 is arranged in a plastic housing 5 having flat external contacts (leadless package). In this plan view, in order to illustrate the components which are embedded in the power semiconductor module 1 or the plastic housing 5, the plastic housing composition 5 has been omitted and merely the external contour of the plastic housing 5 is illustrated by a dashed line 28.

The topmost component that can be seen in said plastic housing composition 5 is a large-area connecting layer 21, which extends areally over the largest part of a top side 7 of a power semiconductor chip 6, the top side 7 having a contact pad 23 for a multiplicity of source electrodes of the power semiconductor chip 6, on which this source connecting area 23 is arranged and which simultaneously projects beyond the edge 15 of the semiconductor chip 6 and extends as far as the regions of top side 10 of source external contacts 19.

Said connecting layer 21 is arranged on a large-area insulation film 25 having the edge sides 29, 30, 31 and 32, said insulation film 25 not only carrying the connecting layer 21 but also having a connecting layer 22, which connects a gate contact area 24 on the top side 7 of the semiconductor chip 6 to the top side 10 of a gate external contact 20. The conductive connecting layers may either be applied in patterned fashion through a mask or be applied in a large-area fashion and subsequently be patterned by means of a photolithographic process and subsequent etching process.

The insulation film 25 serves as an insulation layer 14 and also covers the trenches 34 between the external contacts 13, 19 and 20. Below the insulation film 25, the semiconductor chip 9 with its edge sides 15, 16, 17 and 18 is arranged on the external contact 3 on the left-hand side of FIG. 1.

The rear side of the semiconductor chip 6, said rear side not being visible in this illustration, has a drain contact area that takes up the entire rear side of the semiconductor chip 6. With this drain contact area, the semiconductor chip 6 is arranged on the top side 10 of a drain external contact 13, the areal extent of which, in this embodiment of the invention, is larger than areal extent of the semiconductor chip 6, so that the semiconductor chip 6 can be securely fixed on the large-area drain external contact 13 whilst observing the possible placement tolerances. The top sides 10 of the external contacts 3 are arranged in coplanar fashion in a housing plane and project with their undersides (not shown) as external contact areas on the underside—not visible here—of the plastic housing 5.

Figure 2:
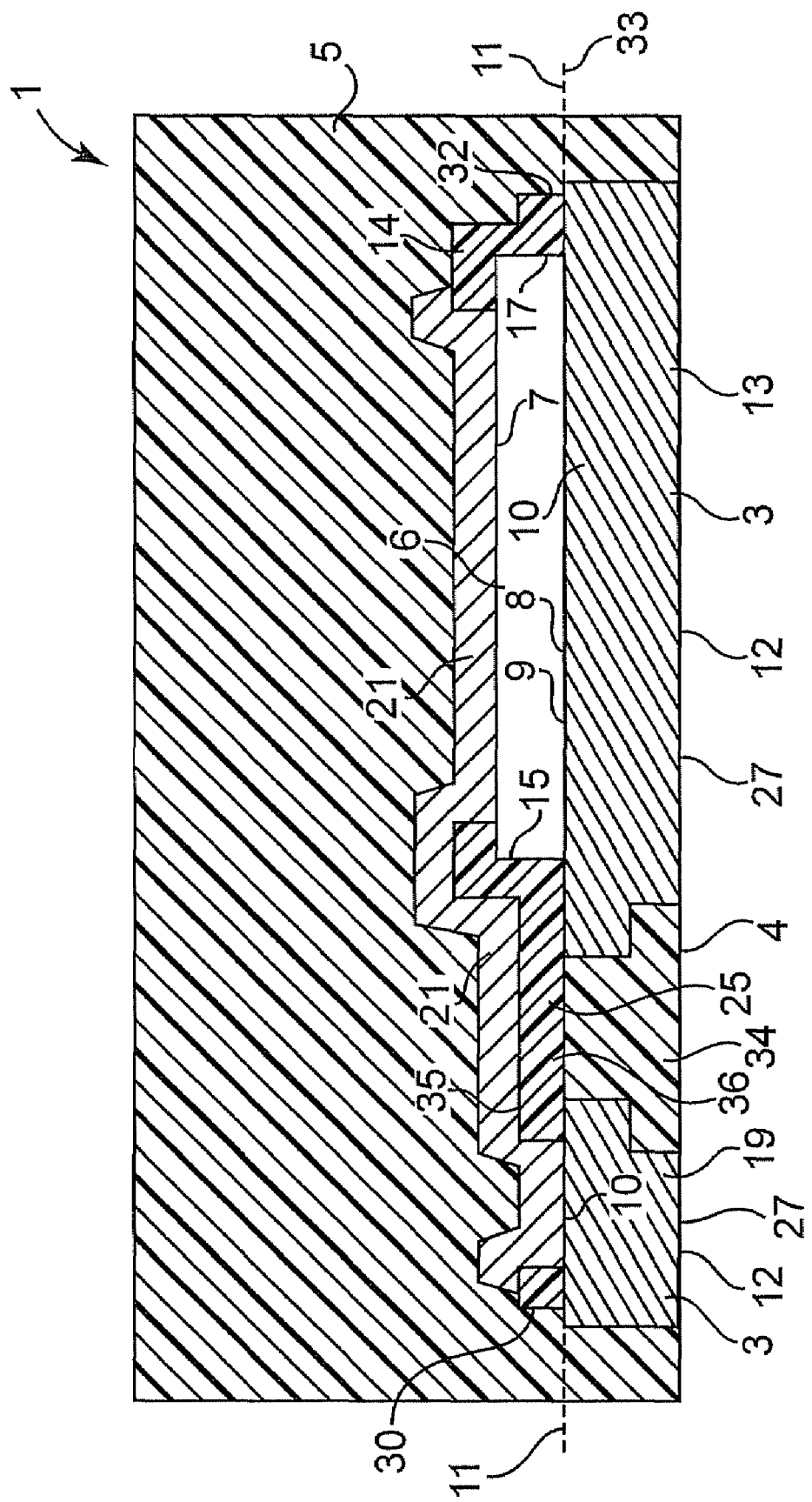
FIG. 2 illustrates a schematic cross section through the power semiconductor module in accordance with FIG. 1 along the sectional line A-A.

FIG. 2 illustrates a schematic cross section through the power semiconductor module 1 in accordance with FIG. 1 along the sectional plane A-A. Components having functions identical to those in FIG. 1 are identified by the same reference symbols and are not explained separately. As illustrated by this cross section of FIG. 2, the power semiconductor module 1 is constructed on a flat conductor frame, the external contact areas 3 of which are shown, the undersides 12 of which external contact areas project on the underside 4 of the semiconductor module 1 of the plastic housing 5 or are at least free of a plastic housing composition 5.

In this cross-sectional plane, on account of the sectional plane A-A of FIG. 1, it is possible to see the cross section of the large-area drain external contact 13 and of a source external contact 19 with their external contact areas 27, the top sides 10 of which are arranged in coplanar fashion in an inner housing plane 11, the position of which is illustrated by the dashed line 33. The semiconductor chip 6 is fixed by its rear side 8, which has a drain contact area 9, on the top side 10 of the drain external contact 13. An insulation film 25 that is dimensionally stable at room temperature is laminated onto the top side 7 of the semiconductor 6 in the edge regions 15 and 17.

The insulation film 25 made of a thermoplastic material is pressed onto the support during lamination and heated, so that it clings to the edge sides 15 and 17 of the semiconductor chip 6, and forms a stable bridge 36 over the trenches 34 between the external contacts 19 and 13 after cooling down at room temperature. A continuous source connecting layer 21 can then be deposited on said insulation film 25, which source connecting layer electrically connects the source contact areas on the top side 7 of the semiconductor chip 6 to the top sides 10 of the source external contacts 19 in large-area fashion.

The production of said connecting layer 21 extending from the top side 7 of the semiconductor chip 6 as far as the top side 10 of the source external contacts 19 can be effected by depositing two plies, namely a first metal ply as adhesion-promoting and/or diffusion-inhibiting ply, and a further ply as a low-resistance electrical connecting layer 21. For this purpose, firstly a metal is applied which adheres well both on the top side 7 of the semiconductor chip 6 and on the top side 35 of the film. This metal coating is subsequently used for depositing a low-resistance layer having a sufficient thickness made of copper or a copper alloy on said metal layer, which is also called a seed layer. The deposition may be continued until a low-resistance electrical connection has been achieved between the contact areas on the top side 7 of the semiconductor chip and the top sides 10 of the external contacts 3.

During the concluding embedding of these components of the power semiconductor module 1 into a plastic housing composition 5, the trenches 34 between the external contacts 3 are also filled with plastic housing composition 5, thereby supporting the bridge 36 formed from the insulation film 25 for corresponding metallic connecting layers 21. In contrast to a connecting technique having bonding wires, it is not possible for drifting of bonding wires and thus undesired short circuits to occur during the embedding of the components of the power semiconductor module 1. Furthermore, the laminated-on insulation film 25 adapted to the surface contour of the semiconductor chip 6 and to the inner housing plane 11 enables the application of a large-area and thick wiring structure within the plastic housing composition.

Figure 3:
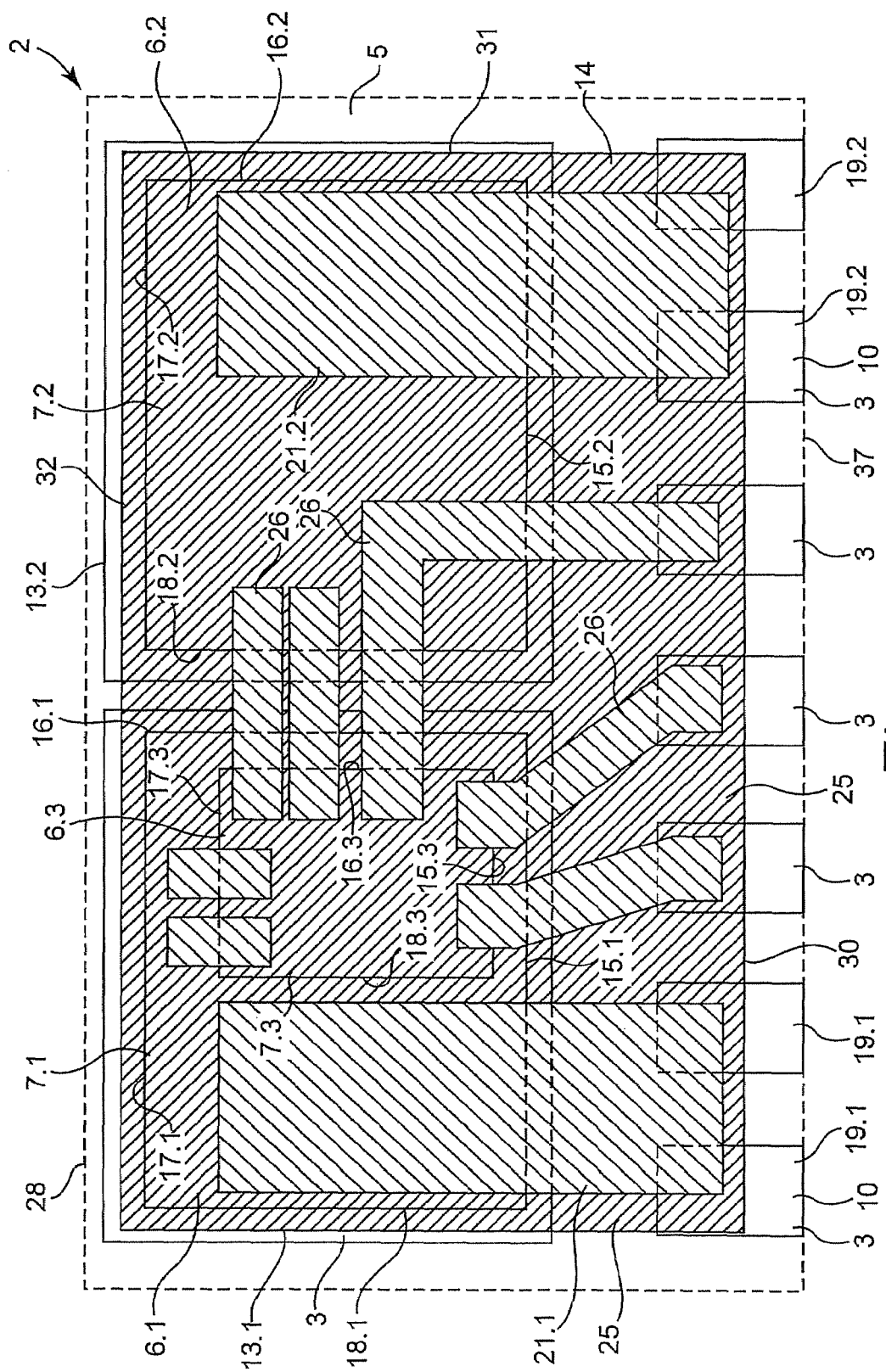
FIG. 3 illustrates a schematic plan view of a power semiconductor module of a second embodiment of the invention.

FIG. 3 illustrates a schematic plan view of a power semiconductor module 2 of a second embodiment of the invention. Components having functions identical to those in FIG. 1 are identified by the same reference symbols and are not explained separately.

In this embodiment of the invention, within the plastic housing 5, the external contour of which is identified by a dashed line 28, two power semiconductor chips 6.1 and 6.2 are connected to corresponding top sides 10 of external contacts 3, the power semiconductor chip 6.1 having a logic semiconductor chip 6.3 on its top side 7.1. An insulation film 25 with its edge sides 29, 30, 31 and 32 is arranged on the top sides 7.1, 7.2 and 7.3 of the semiconductor chips 6.1, 6.2 and 6.3 and also in part on the top sides 10 of the external contacts 3, said insulation film covering the edge sides 15.1 to 18.1, 15.2 to 18.2 and 15.3 to 18.3 of the semiconductor chips 6.1, 6.2 and 6.3.

This insulation layer 14 in the form of an insulation film 25 has arranged on it not only connecting layers 21.1 and 21.2, which connect the source contact areas of the semiconductor chips 6.1 and 6.2 to corresponding source external contacts 19.1 and 19.2, but also further connecting layers 26, which connect contact areas of the stacked logic semiconductor chip 6.3 to contact areas of the power semiconductor chip 6.1 and of the power semiconductor chip 6.2, respectively.

Figure 4:
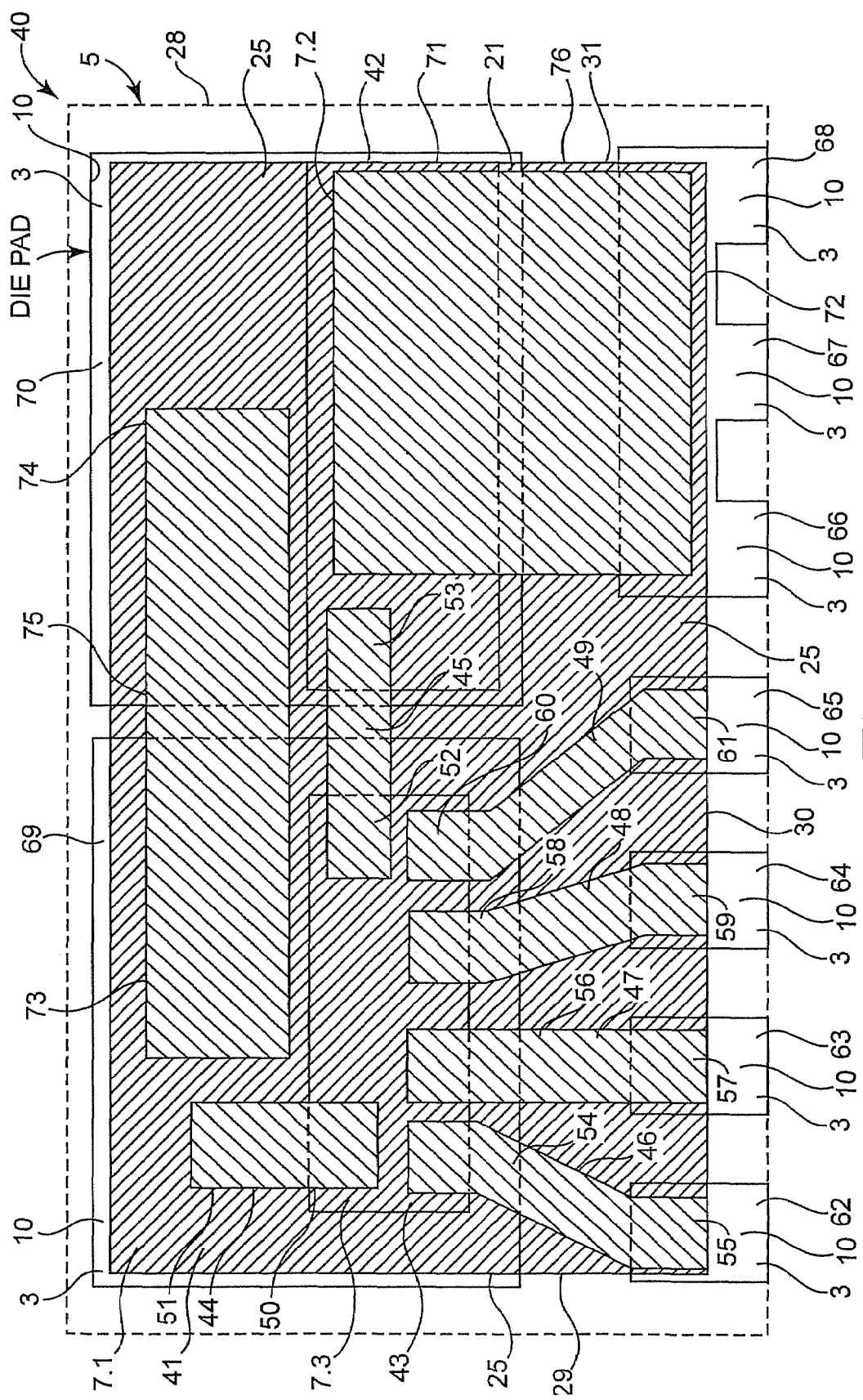
FIG. 4 illustrates a schematic plan view of a power semiconductor module of a third embodiment of the invention.

FIG. 4 illustrates a schematic plan view of a power semiconductor module 40 of a third embodiment of the invention. Components having functions identical to those in the previous figures are identified by the same reference symbols and are not explained separately.

FIG. 4 illustrates active components of a voltage regulator, the plastic housing composition having been omitted for the sake of better clarity and merely the contour of the plastic housing 5 being illustrated by means of a dashed line 28. In this embodiment of the invention, within the plastic housing 5, two power semiconductor chips or power ICs 41 and 42 are connected to corresponding top sides 10 of external contacts, the power semiconductor chip 41 carrying a stacked logic semiconductor chip 43 on its top side 7.1. An insulation film 25 with its edge sides 29, 30, 31 and 32 is arranged on the top sides 7.1, 7.2 and 7.3 of semiconductor chips 41, 42 and 43 and also in part on the top sides 10 of the external contacts 3, said insulation film covering the edge sides of the semiconductor chips 40, 41 and 42. At the same time, said insulation film 25 bridges interspaces between the external contacts 3.

Furthermore, the insulation film 25 has openings for contact areas on the semiconductor chips 40, 41 and 43, and also openings to contact pads on the top sides 10 of the external contacts 3, so that there may be arranged on the insulation film 25 a laminate with patterned striplines 44 to 49 and also 75 and 76, which in part connect the semiconductor chips 40, 41 and 43 among one another and in part connect them to the top sides 10 of the external contacts 3 through the insulation film 25.

The external contacts 62, 63, 64 and 65 are assigned to the logic semiconductor chip and are connected to contact areas 54, 56, 58 and 60 of the logic IC via their contact pads 55, 57, 59 and 61 arranged on the top sides and also the striplines 46, 47, 48 and 59. The logic IC can thus be driven via said external contacts 62, 63, 64 and 65. The logic IC itself is electrically connected to the gate of the first power semiconductor chip 41 via its contact area 50 via the stripline 44 and also via the gate contact area 51 of the first power semiconductor chip 41.

The second power semiconductor chip 42, which is likewise covered only in part by the insulation film 25, is driven by the stacked logic semiconductor chip 43 via the contact area 52 and the stripline 45 and also the gate contact area 53 of the second power semiconductor chip 42.

Besides these signal striplines 44, 45, 46, 47, 48, the logic semiconductor chip 43 stacked on the first power semiconductor chip 41 is electrically connected to corresponding external contacts 62, 63, 64 and 65 and also to gate contact areas 51 and 53 of the two power semiconductor chips 41 and 42.

Furthermore, the power semiconductor module has high-current striplines 75 and 76, which, on the one hand, connect the source contact area 73 to the drain contact area 74 on the top side 10 of the drain external contact 70 of the second power semiconductor chip 42, and a further high-current stripline 76, which connects the source contact area 71 of the second power semiconductor chip 42 to a contact pad 72 on the top side 10 of the source external contacts 66, 67 and 68. Both the high-current striplines 75 and 76 and the signal striplines 44 to 49 can bridge the interspaces between the external contacts since they are supported by the large-area insulation film extending both over the top sides of the semiconductor ICs 41, 42 and 43 and over the top sides of the external contacts 62 to 70 whilst bridging the interspaces between the external contacts.

The invention claimed is:

1. A power semiconductor module comprising:
   surface-mountable flat external contacts, which provide external contact areas on an underside of the power semiconductor module; and
   at least one power semiconductor chip, the top side of the power semiconductor chip comprising source contact areas and gate contact areas and the rear side of the semiconductor chip comprising a drain contact area, the flat external contacts comprising top sides arranged in an inner housing plane, the drain contact area of the rear side of the semiconductor chip being fixed on the top side of a drain external contact, and an insulation layer covering the top side and edge sides of the semiconductor chip and also the housing plane whilst leaving free the source and gate contact areas on the top side of the semiconductor chip and also whilst leaving free contact pads on the top sides of the source and gate external contacts, and the insulation layer bridging an interspace between the external contacts in the region of the inner housing plane in approximately planar fashion.

2. The semiconductor module according to claim 1, the power semiconductor module comprising surface-mountable flat external contacts, which project from a plastic housing on the underside of the power semiconductor module, and comprising at least one power semiconductor chip, the top side of the power semiconductor chip comprising source contact areas and gate contact areas and the rear side of the semiconductor chip comprising a drain contact area, the flat external contacts comprising top sides arranged in an inner housing plane and projecting from the plastic housing by their undersides, the drain contact area of the semiconductor chip being fixed on the top side of a drain external contact, and an insulation film covering the top side and edge sides of the semiconductor chip and also the inner housing plane whilst leaving free the source and gate contact areas on the top side of the semiconductor chip and also whilst leaving free contact pads on the top sides of the source and gate external contacts, and a planar metallic source connecting layer extending on the insulation film from the source contact areas to the top sides of the source external contacts and a gate connecting layer extending from the gate contact areas to the top side of the gate external contact whilst bridging the interspace between the external contacts.

3. The semiconductor module according to claim 1, wherein the source connecting layer and/or gate connecting layer has a multilayer metal layer.

4. The semiconductor module according to claim 1, wherein the multilayer metal layer has an adhesion-promoting lower metal ply and a low-resistance upper metal ply.

5. The semiconductor module according to claim 1, wherein the source connecting layer and/or gate connecting layer comprises an upper metal layer made of copper or made of a copper alloy.

6. The semiconductor module according to claim 1, wherein the flat surface-mountable external contacts comprise copper or a copper alloy.

7. The semiconductor module according to claim 1, wherein the undersides of the external contacts have a solderable coating.

8. The semiconductor module according to claim 1, wherein a stacked semiconductor chip is fixed on the semiconductor chip, the stacked semiconductor chip comprising an integrated logic circuit.

9. The semiconductor module according to claim 2, wherein the insulation film covers the stacked semiconductor chip whilst leaving free contact areas on the top side of the stacked semiconductor chip and carries a patterned planar metallic connecting layer, which in part electrically connects contact areas of the stacked semiconductor chip to contact areas of the semiconductor chip.

10. The semiconductor module according to claim 1, wherein the semiconductor module has a plurality of power semiconductor chips on the coplanar housing plane.

11. A method for producing a power semiconductor module comprising surface-mountable flat external contacts oriented in plane fashion on the underside of the plastic housing, the method comprising:
producing an arrangement of flat external contacts for the surface-mountable semiconductor module in a flat conductor frame, the top sides of the external contacts being oriented in plane fashion and forming a coplanar housing plane;
producing a semiconductor chip, the top side of the semiconductor chip comprising source contact areas and gate contact areas and the rear side of the semiconductor chip comprising a drain contact area;
fixing the semiconductor chip by its drain contact area on a top side of a drain external contact of the flat conductor frame;
applying a patterned insulation layer to the edge sides and the top side of the semiconductor chip and to the coplanar housing plane whilst leaving free the source and gate contact areas and whilst partly leaving free the top sides of the external contacts;
applying a patterned metal layer as a planar connecting layer (21, 22) between source contact areas and surfaces of the source external contacts, and also between gate contact areas and surfaces of the gate external contacts; and
embedding the previously assembled components into a plastic housing composition, external contacts projecting from the plastic housing composition with their external contact areas on the underside of the plastic housing.

12. The method according to claim 11, comprising soldering on the semiconductor chip for the purpose of fixing the semiconductor chip by its drain contact area on a top side of a drain external contact of the flat conductor frame.

13. The method according to claim 11, comprising bonding on the semiconductor chip for the purpose of fixing the semiconductor chip by its drain contact area on a top side of a drain external contact of the flat conductor frame.

14. The method according to claim 11, comprising laminating on an insulation film for the purpose of applying a patterned insulation layer to the edge sides and the top side of the semiconductor chip and to the inner housing plane.

15. The method according to claim 11, stamping an insulation film by means of laser prior to application for the purpose of keeping free the source and gate contact areas and for the purpose of partly leaving free the top sides of the external contacts.

16. The method according to claim 11, patterning an insulation film by means of laser ablation after application for the purpose of keeping free the source and gate contact areas and for the purpose of partly leaving free the top sides of the external contacts.

17. The method according to claim 11, comprising applying the connecting layer by layer.

18. The method according to claim 11, comprising depositing a first ply of the connecting layer by means of a sputtering method.

19. The method according to claim 11, comprising depositing a second ply of the connecting layer by means of an electrolytic method.

20. The method according to claim 18, comprising applying an adhesion-promoting and/or a diffusion-inhibiting electrically conductive layer within the first ply.

21. The use of the method according to 11 claim for producing semiconductor modules in P-TDSON (Plastic Thin Dual Small Outline Non leaded package) housings and/or modifications of this housing type.

22. The use of the method according to claim 11 for producing semiconductor modules in P-VQFN (Plastic Very thin profile Quad Flat Non leaded package) housings and/or modifications of this housing type.

23. A power semiconductor module comprising:
means for providing surface-mountable flat external contacts, which provide external contact areas on the underside of the power semiconductor module; and
at least one power semiconductor chip, the top side of the power semiconductor chip comprising source contact areas and gate contact areas and the rear side of the semiconductor chip comprising a drain contact area, the flat external contacts means comprising top sides arranged in an inner housing plane, the drain contact area of the rear side of the semiconductor chip being fixed on the top side of a drain external contact, and an insulation layer covering the top side and edge sides of the semiconductor chip and also the housing plane whilst leaving free the source and gate contact areas on the top side of the semiconductor chip and also whilst leaving free contact pads on the top sides of the source and gate external contacts, and the insulation layer bridging an interspace between the external contacts in the region of the inner housing plane in approximately planar fashion.

* * * * *